United States Patent [19]

Earle

[11] Patent Number: 5,642,052

[45] Date of Patent: Jun. 24, 1997

[54] HAND-HELD TESTER FOR RECEPTACLE GROUND FAULT CIRCUIT INTERRUPTERS

[75] Inventor: Kent L. Earle, Woodridge, Ill.

[73] Assignee: Etcon Corporation, Burr Ridge, Ill.

[21] Appl. No.: 461,427

[22] Filed: Jun. 5, 1995

[51] Int. Cl.$^6$ .................................................. H01H 31/02
[52] U.S. Cl. ........................................... 324/556; 324/555
[58] Field of Search ...................................... 324/555, 556,
324/508, 509, 510, 522, 512, 523, 527,
531, 532, 537, 538

[56] References Cited

U.S. PATENT DOCUMENTS

| | | | |
|---|---|---|---|
| 3,898,557 | 8/1975 | Strock | 324/510 X |
| 4,135,129 | 1/1979 | Johnston et al. | 324/509 |
| 4,280,092 | 7/1981 | Wells, Jr. et al. | 324/508 |
| 4,292,585 | 9/1981 | Charette | 324/510 |
| 5,285,163 | 2/1994 | Liotta | 324/508 |
| 5,525,908 | 6/1996 | Brownell | 324/508 |

OTHER PUBLICATIONS

ETCON Electronic Products Brochure ("ETCON... Expect More") (1989); pp. 1–12.

Primary Examiner—Sandra L. O'Shea
Assistant Examiner—Roger Phillips
Attorney, Agent, or Firm—Banner & Witcoff, Ltd.

[57] ABSTRACT

An electrical test device for testing the function of a receptacle ground fault circuit interrupter. The tester plugs into a receptacle and includes a current source, timer, testing circuit, and display. The current source introduces a substantially constant fault current between the hot and ground leads of the receptacle. Once this occurs, the timer begins counting time and generates a time count signal. The test circuit receives the time count signal and determines whether the interrupter enters a tripped state within a designated time. The testing circuit responsively generates a trip indicator signal reflecting whether or not the ground fault interrupter circuit tripped within the designated trip time. The display means receives the trip indicator signal and responsively indicates whether the interrupter functioned properly by tripping the designated trip time. Further, the tester includes a volt meter and wiring status indicator to advise the user of the voltage between the hot and neutral lines of the receptacle as whether the receptacle has been incorrectly connected to power lines.

13 Claims, 5 Drawing Sheets

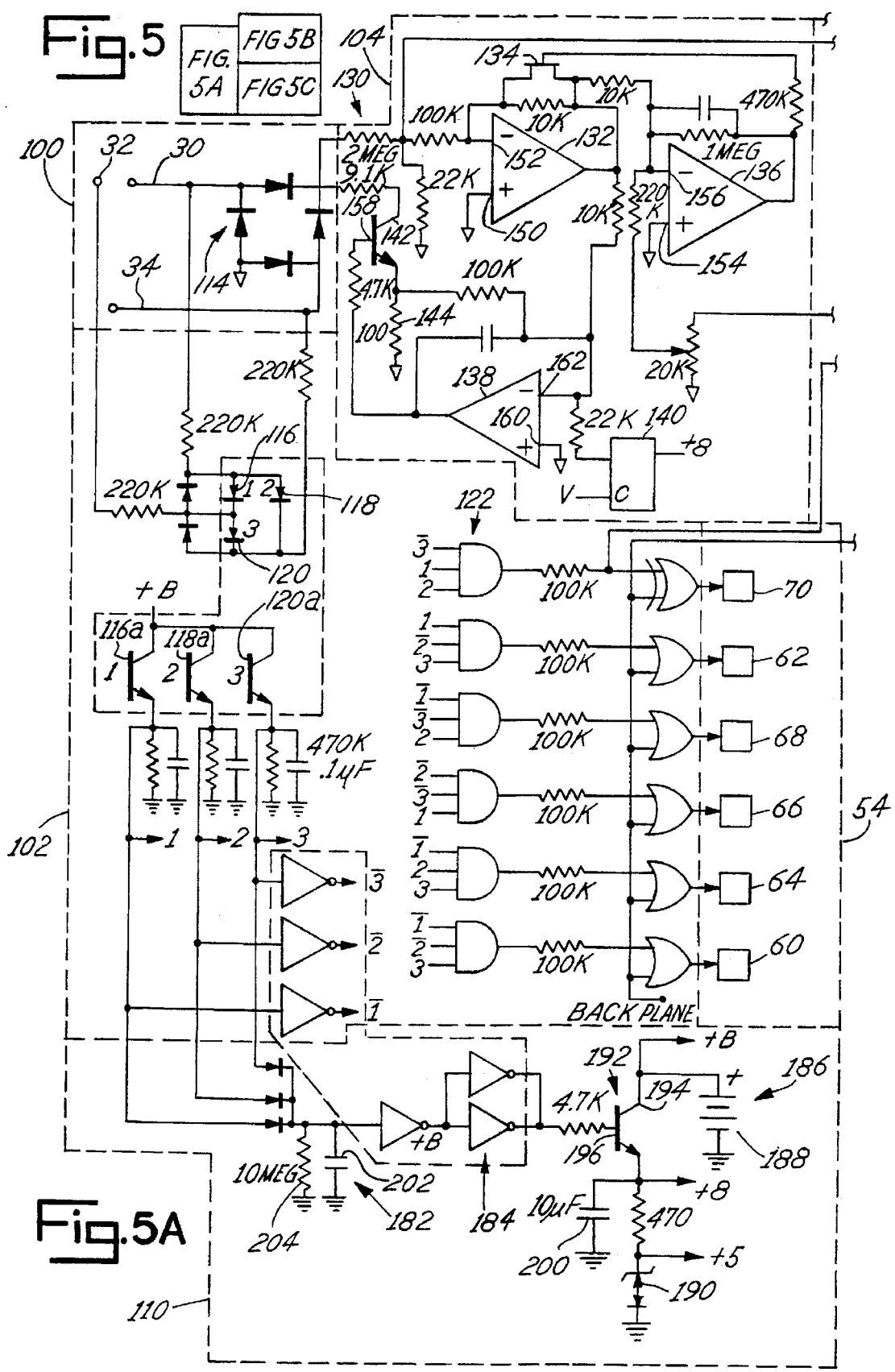

HAND-HELD TESTER FOR RECEPTACLE GROUND FAULT CIRCUIT INTERRUPTERS

BACKGROUND OF THE INVENTION

The present invention relates to electrical test devices and, more particularly, to a device for testing receptacle ground fault circuit interrupters. A typical power receptacle often includes three female connectors designed to accept a three prong male plug of an electrical device or appliance. The three prongs may be referred to as the "hot," "neutral," and "ground" prongs. The power receptacle, in turn, interconnects the three prongs to the hot, neutral, and ground lines, or conductors, in a local electrical system.

In a typical power circuit in the United States, the power at a receptacle in a home or office is supplied at 110 volts, root-mean-square ("RMS"). The voltage at the "hot" prong may vary between approximately +160 V and −160 V ($\pm 110 \times 2^{1/2}$). The neutral line stays at approximately 0 V relative to the "hot" line. The ground line is typically connected to an earth ground (approximately 0 V). Absent an improper "short circuit" between, for example, a hot wire in the appliance and the metal case of the appliance, the ground line does not carry substantial current.

When the hot line is at a positive voltage, source current flows along the hot line, through the electrical device, and then returns along the neutral line. Under normal operating conditions, with the electrical appliance operating properly, the current flowing through the hot line substantially equals the current returning along the neutral line.

It is possible, however, that a short may occur in the electrical appliance or along the remainder of the building circuit interconnected to the receptacle. The situation described might occur, for example, when a hot wire within the appliance becomes frayed and comes into contact with a metal casing on the electrical device. In such a case, the current flowing through the hot line may not return along the neutral line, but may, instead, flow to ground via an "improper" route. Such an improper route may be, for example, through the metal casing of the device and through the body of a human operator who is holding the device. This current is referred to as a "fault current."

Ground fault circuit interrupters, also referred to as GFCIs, are designed to quickly cut off the flow of current in an electrical circuit after the GFCI detects a sufficient fault current, thereby reducing the likelihood of electric shock. To function effectively, a GFCI must be capable of interrupting the electrical circuit within a relatively small time period after it detects a substantial ground fault.

Most GFCIs operate by detecting a difference between the level of current flowing through the hot line and the level of current flowing through the neutral line. This difference may be caused by a fault current improperly flowing to ground. When a fault current above a predetermined level is detected, a GFCI may respond, or "trip," interrupting the flow of current through the hot line.

Published industry standards describe the operation of some GFCIs. For instance, Underwriters Laboratories, Inc. has published Standard No. UL 943, which sets forth, in part, the maximum amounts of time in which a GFCI should trip in the presence of particular levels of fault current. More particularly, UL 943 includes a substantially exponential graph of GFCI-current versus trip time.

Ground fault circuit interrupters are often integrated together with standard power receptacles. The resulting single unit may be referred to as a receptacle ground fault circuit interrupter. Such a "receptacle GFCI" offers protection for users of devices plugged into the power receptacle.

Once a receptacle GFCI has been installed in a house or other building, it may be necessary to perform a variety of tests to ensure that the unit is properly connected to the local power circuit and further to ensure that the GFCI is operating properly. For example, an electrician installing or inspecting a receptacle GFCI may need to verify that the hot, neutral, and ground leads on the rear of the unit are properly connected, respectively, to the hot, neutral, and ground conducting lines of the local electrical power circuit. In the event any of these lines are reversed or are not connected, a power line may be absent or misconnected.

As another example, the electrician may need to accurately determine the voltage across the hot and neutral lines of the power receptacle. If the electrician is measuring the line voltage at a receptacle in the U.S. and determines that the voltage across the hot and neutral lines is substantially different that 110 V, RMS, the electrician may have reason to know that a problem exists in the building's electrical wiring.

Further, the electrician may need to determine whether the GFCI portion of the unit will function properly. Existing GFCI testing devices generally operate by shunting the hot line to the ground line in the power circuit, thereby causing current on the hot line to flow directly to ground, rather than flowing back along the neutral line. Sensing the resulting difference in current level between the hot and neutral lines, a properly functioning GFCI should promptly trip. If the GFCI fails to trip when thus tested, the GFCI may be defective and may need to be repaired or replaced.

Unfortunately, many existing GFCI test devices do not conveniently enable an electrician on site in a house or other building to determine whether the GFCI will trip quickly enough for a particular level of fault current. Thus, many portable GFCI testers do not determine whether the GFCI being tested trips within a proper time duration for a given level of fault current, such as those maximum time durations set forth in U.L. Standard UL 943.

Furthermore, presently available portable test devices for receptacle GFCIs often also fail to meet the additional needs of the on-site electrician mentioned above. For instance, existing portable equipment often fails to provide clear and easy-to-read indications of voltage and whether the hot, neutral, and ground leads of the receptacle unit are properly connected to, or disconnected from, the corresponding hot, neutral, and ground lines of the local electrical circuit. Additionally, some of the presently available electrical testing devices are cumbersome, heavy, and expensive.

SUMMARY OF THE INVENTION

In a principal aspect, the present invention is a testing device for a receptacle ground fault circuit interrupter. The tester includes a plug which interconnects to the interrupter, a current source, a testing circuit, and a display.

The current source introduces a substantially constant fault current between the hot and ground leads, simulating a condition that a GFCI is intended to detect. A timer circuit counts the time after the current source begins to introduce the fault current. The testing circuit determines whether the interrupter has entered the trip state within a designated trip time. The display responsively indicates whether the interrupter worked properly by tripping within the designated time.

In another embodiment of the invention, the tester is a multi-function tester that not only performs such a GFCI test, but also allows an electrician or technician to effectively perform a variety of other tests. Such other tests include voltage measurement and a determination of whether the receptacle is correctly wired to the power supply, as well as checking for proper operation of the GFCI.

An alternative embodiment of the present invention may also include means for adjusting the magnitude of the constant current source. The embodiment may also include corresponding means for automatically determining the maximum time by which the GFCI must trip in the presence of the selected magnitude of constant current.

Thus, an object of the present invention is an improved, portable testing device for receptacle ground fault circuit interrupters. A further object of the invention is a portable testing device that is better able to test a receptacle ground fault circuit interrupter.

Yet a further object of the present invention is a portable testing device that is better able to test the operational integrity of a receptacle ground fault circuit interrupter while also being capable of indicating whether the receptacle ground fault circuit interrupter has been properly connected to the wires of the local electrical circuit. Still a further object is a portable testing device with the above-mentioned features and further capable of measuring and indicating the voltage level at the hot line of an installed receptacle ground fault circuit interrupter.

Another object is a multi-function tester that allows an electrician or technician to quickly and effectively perform a combination of tests on receptacle ground fault circuit interrupters, with less need for cumbersome or costly factory testing equipment. The above and other objects, features, and advantages of the present invention are discussed or apparent in the following detailed description.

BRIEF DESCRIPTION OF THE DRAWINGS

A preferred embodiment of the present invention is described herein with reference to the drawings wherein:

FIG. 5 is a diagram showing the arrangement of the circuit diagram of FIGS. 5A, 5B and 5C; and FIGS. 5A, 5B and 5C are a circuit diagram of the tester shown in FIG. 4.

DETAILED DESCRIPTION OF THE PREFERRED EMBODIMENT

Figure 1:
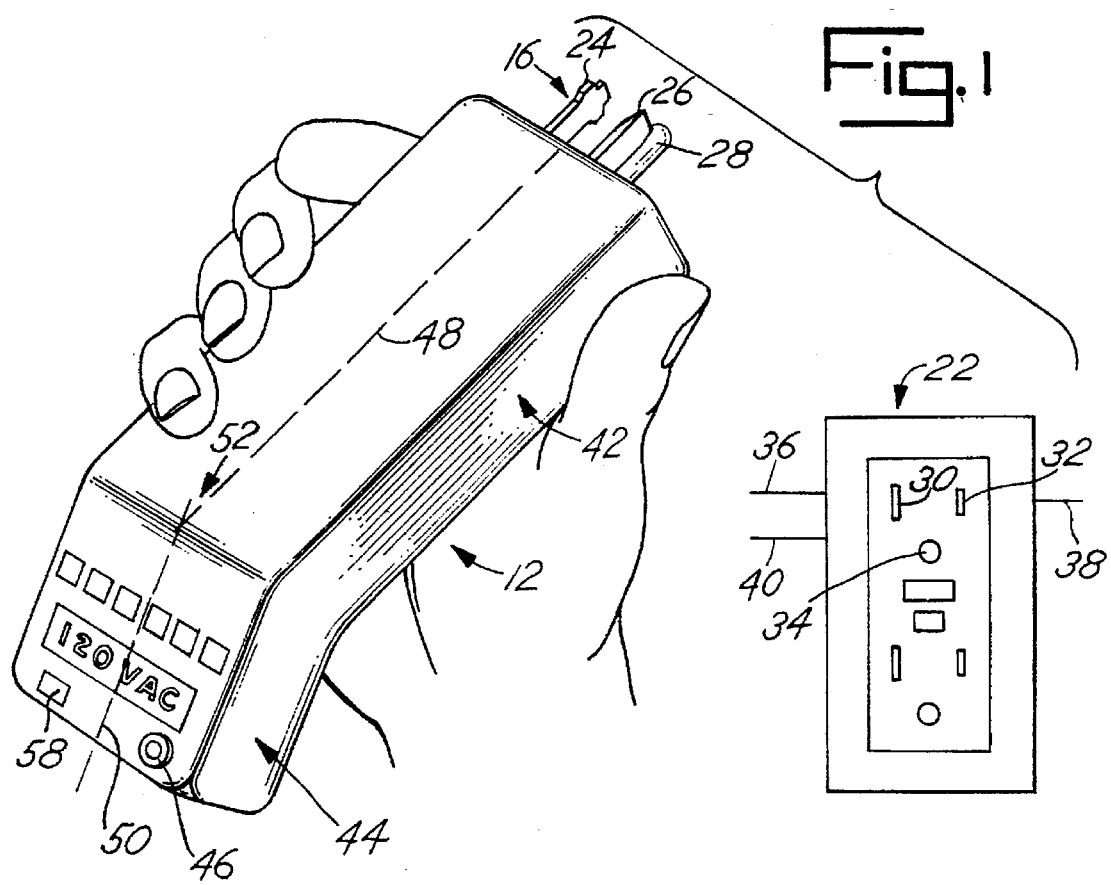
FIG. 1 is an isometric view of tester made in accordance with a preferred embodiment of the present invention, where the tester is held by a technician.
Figure 2:
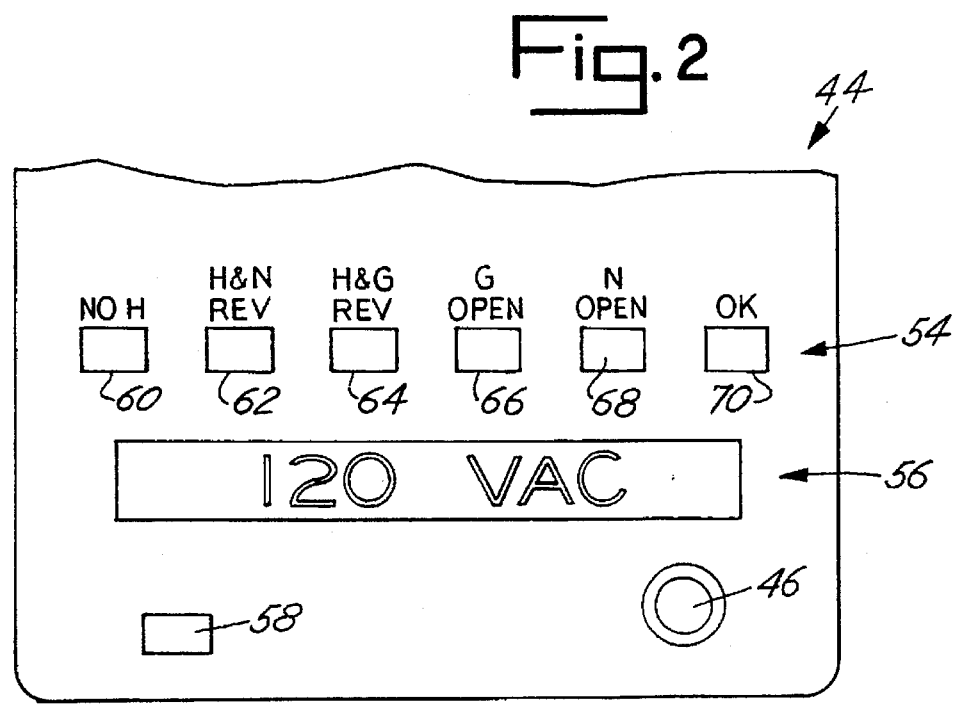
FIG. 2 is a face view of the display illustrated on the tester shown in FIG. 1.
Figure 3:
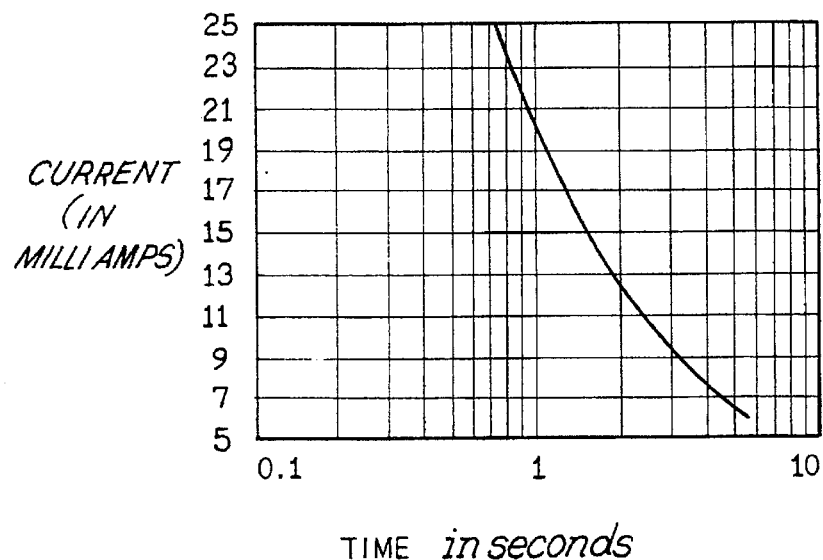
FIG. 3 is a graph illustrating a preferred function of current versus trip time for a ground fault circuit interrupter, such as that shown in FIG. 1.
Figure 4:
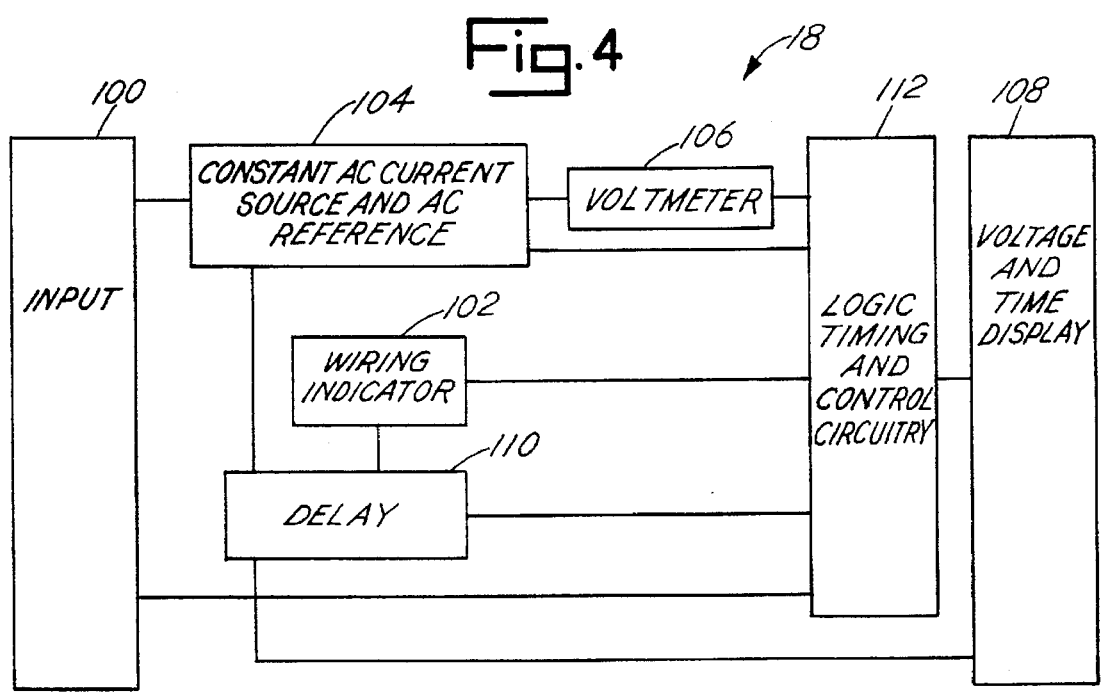
FIG. 4 is a block diagram of tester shown in FIG. 1.

Referring to FIGS. 1–5, a preferred embodiment of the present invention is shown as an electrical tester 10. As shown in FIGS. 1 and 4, the tester 10 includes a case 12, plug 16, and internal circuitry 18. The plug 16 may be received by a receptacle ground fault circuit interrupter ("receptacle GFCI") 22. The tester 10 may perform a series of tests on the receptacle GFCI 22.

In the preferred embodiment, the plug 16 comprises three male prongs 24, 26, 28. The receptacle GFCI 22 includes three female connectors or leads 30, 32, 34 for receiving the male prongs 24, 26, 28. The three female leads 30, 32, 34 may be designated, respectively, as hot, neutral, and ground leads. The hot, neutral, and ground leads 30–34 of a properly installed receptacle GFCI 22 are, in turn, respectively connected to hot, neutral, and ground conducting lines 36, 38, 40, which are part of a local electrical power system (not shown).

The case 12 of the tester 10 is comprised of electrically insulating plastic and is designed to easily fit in the hand or pocket of an electrician, testing technician, or other user. The case 12 preferably includes a plug section 42, display section 44, and an activation button 46.

The tester 10 is capable of efficiently and effectively performing a series of tests on the receptacle GFCI unit 22, and the results of these tests are displayed in the display section 44 for quick reference by the user of the tester 10.

As shown in FIG. 1, the plug and display sections each substantially define an imaginary longitudinal axis, 48, 50. The two longitudinal axes define an angle 52 between them, such that the display section 44 is angled with respect to the plug section 42. Consequently, the user is better able to see the display section 44 when the plug 16 has been inserted into the receptacle GFCI 22. The angle 52 is preferably greater than approximately 15° and less than approximately 90° for better viewing by the user.

The display section 44 is shown in FIG. 2. The section 44 includes a wiring status display 54, voltage and time display 56, and battery level indicator segment 58.

As discussed above, the hot, neutral, and ground leads of a properly installed receptacle GFCI should be connected, respectively, to the hot, neutral, and ground conducting lines of a local electrical power circuit. When the testing device 10 of the present invention is initially plugged into the receptacle GFCI 22, the internal circuitry 18 in the testing device 10 provides an easy-to-read indication on the wiring status display 54 of whether the wiring is in a correct or an incorrect state: whether the leads 30–34 have been properly connected to the conductors or lines 36–40.

More particularly, the wiring status display 54 provides an indication of whether or not the lines are correctly connected via six sub-segments 60, 62, 64, 66, 68, 70. The sub-segments 60–70 indicate the following conditions when activated:

Sub-segment 60: Hot line not connected ("No H");

Sub-segment 62: Hot and Neutral lines reversed ("H & N Rev.");

Sub-segment 64: Hot and Ground lines reversed ("H & G Rev. ");

Sub-segment 66: Ground line not connected ("N Open");

Sub-segment 68: Neutral line not connected ("N Open").

In the preferred embodiment, the sub-segments 60–70 are comprised of liquid crystal displays. Notably, not all fault conditions are necessarily tested for. If, for example, the ground and neutral lines 36, 38 are reversed, or if two hot wires have been connected to the receptacle 22, or if a ground path exists, but is of poor quality, the tester 10 may not detect such conditions.

When initially operated, the tester 10 measures the voltage level at the hot lead 30 in the receptacle GFCI 22. The tester 10 then displays this voltage level on the display 56.

The tester 10 may determine that one or more of the hot, neutral, and ground lines 36–40 are incorrectly connected to the receptacle GFCI 22. In this event, in the preferred embodiment of the present invention, all wiring indicators on the tester 10 will begin flashing and a "00" Volt reading will be presented in the display 56, alerting the user that an incorrect wiring status exists. If, however, the tester 10 determines that all pertinent wiring is correct, then the tester 10 will display an accurate voltage reading in the display 56.

Assuming that the hot, neutral, and ground lines 36–40 are each correctly connected and that the hot line 36 is conducting, as indicated by a non-zero voltage reading in the display 56, the tester 10 is prepared to test the operational integrity of the GFCI portion of receptacle GFCI 22. In the preferred embodiment, a user activates testing of the GFCI by pressing the activation button 46. When thus activated, a constant ground "fault current" is shunted from the hot line 30. As a result, the return current flow along the neutral line 38 is less than the current flow in the hot line 36, thereby effecting a controlled current differential between the hot and neutral lines 36, 38. This controlled current differential between the hot and neutral lines 36, 38 should cause a properly functioning GFCI to trip within a maximum period of time, such as those times as prescribed by industry standards.

Underwriters Laboratories, Inc. has published its standard No. UL 943. According to UL 943, a GFCI must trip within a maximum period of time for a given magnitude of fault current. More particularly, UL 943 currently provides that, given a current of magnitude I (measured in milliamperes), a GFCI should trip within t seconds, where $t=(20/I)^{1.43}$. Referring to FIG. 3, there is shown an exponential graph, which sets forth the required maximum trip times for given magnitudes of fault current.

The present invention simulates "on site" (in a house or other building) a more complete factory test of the receptacle GFCI 22, by providing means to test whether the GFCI trips within the maximum allowed time period prescribed by UL 943 for a given magnitude of constant fault current. In the preferred embodiment, the constant current source in the tester 10 is set to approximately 6.4 milliamps, although it is contemplated that the present invention may be used with other currents. For example, the tester 10 may be set to introduce a fault current of 5 to 7 milliamps.

Given a constant fault current of 6.4 milliamps, UL 943 provides that a safe GFCI should trip within 5.1 seconds. Once the user activates the GFCI testing circuitry of the present invention, the timing circuitry begins counting time (in tenths of seconds) until the GFCI 22 moves from a dormant state to a tripped state. A continuous time count is displayed on the display segment 56.

If the GFCI 22 moves to the tripped state and blocks the flow of current along the hot lead 30 within the prescribed maximum period of time, the display segment 56 indicates the final time at which the receptacle GFCI 22 tripped. On the other hand, if the receptacle GFCI fails to trip within the prescribed maximum time period, the maximum allowed time will flash within the display segment 56.

Applying the example of the preferred embodiment, in which a constant 6.4 milliamps fault current is applied, for instance, if the receptacle GFCI 22 trips after 4.1 seconds of the 6.4 milliamps fault current, "4.1" will be shown in the time display segment 56. However, should the receptacle GFCI 22 fail to trip within 5.3 seconds after the fault current was introduced, then "5.3" will flash in the display segment 56, alerting the user that the receptacle GFCI 22 may need to be repaired or replaced.

It is further contemplated that the present invention may include means for allowing a user to select any of a range of constant current source magnitudes. In such an alternative embodiment, the present invention would be equipped with means for determining the maximum prescribed trip time for the selected current according to published industry standards, such as UL 943.

In yet an another alternative embodiment, it is contemplated that the present invention may include one or two more input devices, such as buttons or knobs, by which a user may select either (1) a constant current source magnitude or (2) a maximum trip time. Thus, a user may select (1) any one of a range of simulated fault current magnitudes or (2) any one of a range of maximum times in which the subject GFCI must trip. The tester 10 would then include a memory device, such as a lookup table or a processor capable of calculating the appropriate mathematical function, to determine the maximum trip time or simulated fault current that corresponds to the fault current or trip time selected by the user. The tester would then indicate to the user whether, the GFCI tripped (1) within the appropriate trip time or (2) as a result of no more than the appropriate current for the trip time chosen by the user. This alternative embodiment is intended, in part, to permit the present invention to be used with any applicable industry standard for the proper operation of a GFCI.

Referring now to FIG. 4, there is shown a block diagram of the main functional feature blocks of the present invention. The internal circuitry 18 of the tester 10 includes an input 100, wiring indicator 102, constant current source and AC reference ("current source") 104, voltmeter 106, voltage and time display ("display") 108, power up and delay circuit 110, and logic, timing, and control circuitry 112.

The input 100 receives power from the plug 16 and provides a line power signal to the remainder of the internal circuitry 18. The current source 104 provides a constant current which may be used to provide a substantially constant fault current from the hot line.

The voltmeter 106 tests the voltage at the hot lead 30 and provides an output to the display 108, such that the voltage may be observed by the user. The wiring indicator 102 detects whether the leads 30–34 have been mis-wired with respect to the lines or conductors 36–40 and provides an appropriate response to the display 108. The power up and delay circuit 110 allows the display 108 to be maintained, even after the plug 16 has been removed from the receptacle 22. Thus, after the tester 10 times the period necessary for the GFCI 22 to trip or move to an open circuit condition, the display 108 shows this elapsed time long enough for the user to observe it. The delay feature is also useful when, for example, where the tester 10 is being used in a position where the user cannot see the display section 44 when the tester 10 is plugged in.

The voltage and time display 108, which includes the displays 54, 56, communicates test results to user. The logic, timing, and control circuitry operates the GFCI test and controls the overall operation of the tester 10.

Turning now to FIG. 5, there is shown a more detailed circuit diagram of each of the blocks depicted in FIG. 4. Each of the modules 100–112 is described below.

Input 100

The input 100 includes a rectifier 114 for converting the AC input signal from the leads 30, 34 to a full wave rectified signal. The resulting rectified signal is supplied to other elements of the internal circuitry 18.

Wiring indicator 102

The indicator 102 includes a first, second, and third opto-isolators 116, 116a; 118, 118a; 120, 120a interconnected to the neutral lead 32. The opto-isolators 116–120 are powered by a +5 volt battery signal. The isolators 116–120 provide non-inverted and inverted signals, or wiring state indication signals, to the logic circuitry 122.

If the leads 30-34 are properly interconnected, the first and second opto-isolators 116, 118 conduct and the third opto-isolator 120 does not, such that the sub-segment 70 will be activated. Various other combinations of conduction of current by the opto-isolators 116-120 provide power to the appropriate LCD sub-segments 60-78, such that the sub-segments 60-68 will blink and advise the user of a possible wiring error. The logic circuitry 122 draws approximately five microamps when inactive. As a result, the battery shelf life is not substantially diminished by the logic circuitry 122.

The logic circuitry 122 does not use specialized drive circuitry for the sub-segments 60-70, which would further add expense. Given the limited amount of time that the sub-segments 60-70 will typically be activated, the configuration used does not significantly reduce the life expectancy of the segments 60-70.

Constant Current Source and AC Reference 104

The constant current source and AC reference 104 receives the rectified signal from the input 100. The AC voltage at the hot lead 30 may vary from 102 volts RMS to 132 volts RMS. Nonetheless, when activated the current source 104 must provide, or draw, substantially 6.4 milliamps over the entire range of input voltages on the hot lead 30.

The current source 104 includes current limiting resistors 130, a primary operational amplifier 132, Junction Field Effect Transistor (JFET) 134, voltage error amplifier 136, current error amplifier 138, activating switch 140, primary transistor 142, and current feedback resistor 144.

The operational amplifier 132 has a positive input 150, interconnected to a phantom ground, and a negative (inverting) input 152. The JFET 134 acts as a variable resistor in a feedback loop of the primary operational amplifier 132.

The hot lead 30 is interconnected, through the current limiting resistors 130, to the inverting input 152 of the primary operational amplifier 132. Thus, to the extent that the output of the primary operational amplifier 132 begins to change, a feedback loop through the JFET 134 tends to change the input 152 of the operational amplifier 132, which tends to drive the output of the operational amplifier 132 back toward its initial condition.

The output of the primary operational amplifier 132 is applied to both the voltage error and the current error amplifiers 136, 138. The voltage error amplifier 136 has a positive input 154 interconnected to a phantom ground and a negative (inverting) input 156. In addition to amplifying "errors" for a feedback signal, the amplifier 136 also filters and averages the 120 hertz full-wave rectified reference signal.

In response, for example, to an increasingly negative output from the primary operational amplifier 132, the voltage error amplifier 136 receives a larger signal at its negative input 156 and responsively provides a greater positive output to the base of the JFET 134. The higher input to the gate decreases the source to drain resistance of the JFET 134. The decrease in resistance allows the negative output of the primary operational amplifier 132 to reduce the magnitude of the positive pulses applied by the hot lead 30 to the input 152. Consequently, the output of the primary operational amplifier 132 is stabilized.

The primary transistor 142 includes a base 158. The current error amplifier 138 has a positive input 160, interconnected to a phantom ground, and a negative (inverting) input 162. The activation switch 140 may receive a positive voltage ("V") input signal, signifying that the tester 10 is in a voltage (rather than a timed ground fault interrupt circuit) testing mode. Consequently, the electronic activating switch 140 closes, providing a positive eight volt signal to the negative input of the current error amplifier 136. Consequently, no substantial positive voltage is applied to the base 158 of the primary transistor 142. Thus, the primary transistor 142 is turned off, and no current is drawn during a voltage measurement by the tester 10.

When no large voltage signal is applied to the switch 140, the switch 140 is open, and the outputs of the primary and current error amplifiers 132, 138 regulate the signal to the base 158 of the transistor 142, such that the transistor 142 draws current from the hot lead 30.

Should the current being pulled by the primary transistor 142 increase, the voltage across the current control resistor 144 will increase. Consequently, the signal applied to the inverting input 162 of the current error amplifier 138 will increase, which, in turn, result in a smaller signal applied to the base of the transistor 142. Thus, the current drawn by the primary transistor 142 is substantially stabilized. In the preferred embodiment shown, this current equals approximately 6.4 milliamps.

Voltmeter 106

The voltmeter 106 measures the voltage at the hot lead 30. In the preferred embodiment, the voltmeter 106 includes a DC regulating stage 164, ramp and pedestal circuit 166, and phantom ground circuit 170. The DC regulating stage 164 filters and stabilizes the rectified signal from the input 100.

The ramp and pedestal circuit 166 includes a temperature compensated constant current source 172, capacitor 174, and comparator 176. When activated, the current source 172 provides a substantially constant current to the capacitor 174. Thus, the capacitor 174 charges at a substantially linear rate. The comparator 176 detects when the voltage on the capacitor 174 has charged to the same voltage as the voltage supplied to it by the regulating stage 164 (which represents the voltage of the hot lead 30). The comparator 176 responsively provides a low output signal, and the count of the clock circuit (which represents how long the capacitor 174 took to charge and, thus, the magnitude of the voltage of the hot lead 30) is enabled to be loaded into the display 56.

The phantom ground circuit 170 includes an operational amplifier 176 that receives a nominal 9 volt input derived from the battery voltage. The output of the amplifier 176 is a fairly stable reference point of approximately ½ the battery voltage, which may be used by other components of the internal circuitry 18.

Voltage and Time Display 108

Figure 5B:
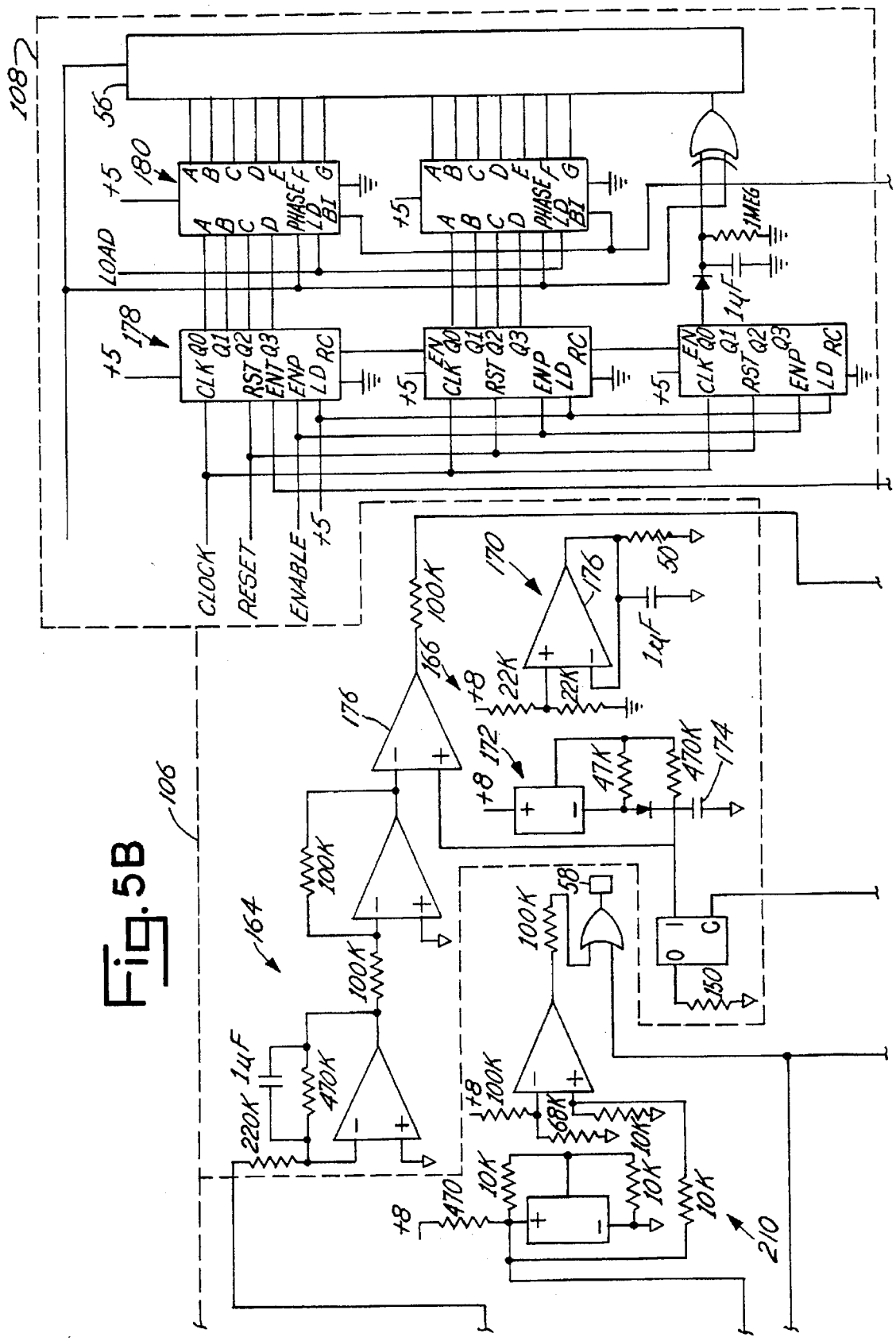

As shown in FIG. 5B, the voltage and time display 108 includes a digital counter 178 (comprised of three 74HC160 integrated circuits). The display 108 also includes a display driver 180 (comprised of two MC14543B integrated circuits and an exclusive OR gate), and the liquid crystal display 56.

Power Up and Delay Circuit 110

The outputs of the three opto-isolators 116-120 are joined (as a diode AND circuit) and provided to a resistor-capacitor ("RC") circuit 182, a CMOS drive circuit 184, and a power circuit 186. The power circuit 186 includes a nine volt battery 188, which provides a positive battery ("B") voltage to the rest of the internal circuitry 18 of the tester 10. The power circuit 186 also includes a zener diode 190, which provides a five volt reference voltage, and a transistor 192, which includes a collector 194, base 196, and emitter 198, and a capacitor 200. Given an approximate 1.2 volt base to emitter drop in the transistor 170 and a nine voltage battery signal at the collector 194 of the transistor 192, the power circuit 186 provides approximately eight volt reference voltage, which is steadied by the ten microfarad capacitor 200.

The RC circuit 182 includes a capacitor 202 that will discharge relatively slowly through a larger resistor 204. Thus, the transistor 192, is kept on, and the display 56 will continue to be powered, for five or six seconds after the tester 10 has been unplugged from the receptacle GFCI 22.

The transistor 192 is turned on only when at least one of the opto-isolators 116–120 is conducting current. In such a case, with the transistor 192 on, the five and eight volt reference voltages are provided to the rest of the internal circuitry. Notably, the operation of the tester 10 is not dependant on receiving power from the receptacle GFCI 22. Consequently, the nature of the line conditions being monitored does not affect the proper operation of the tester 10.

Logic, Tinting and Control Circuit 112

Figure 5C:
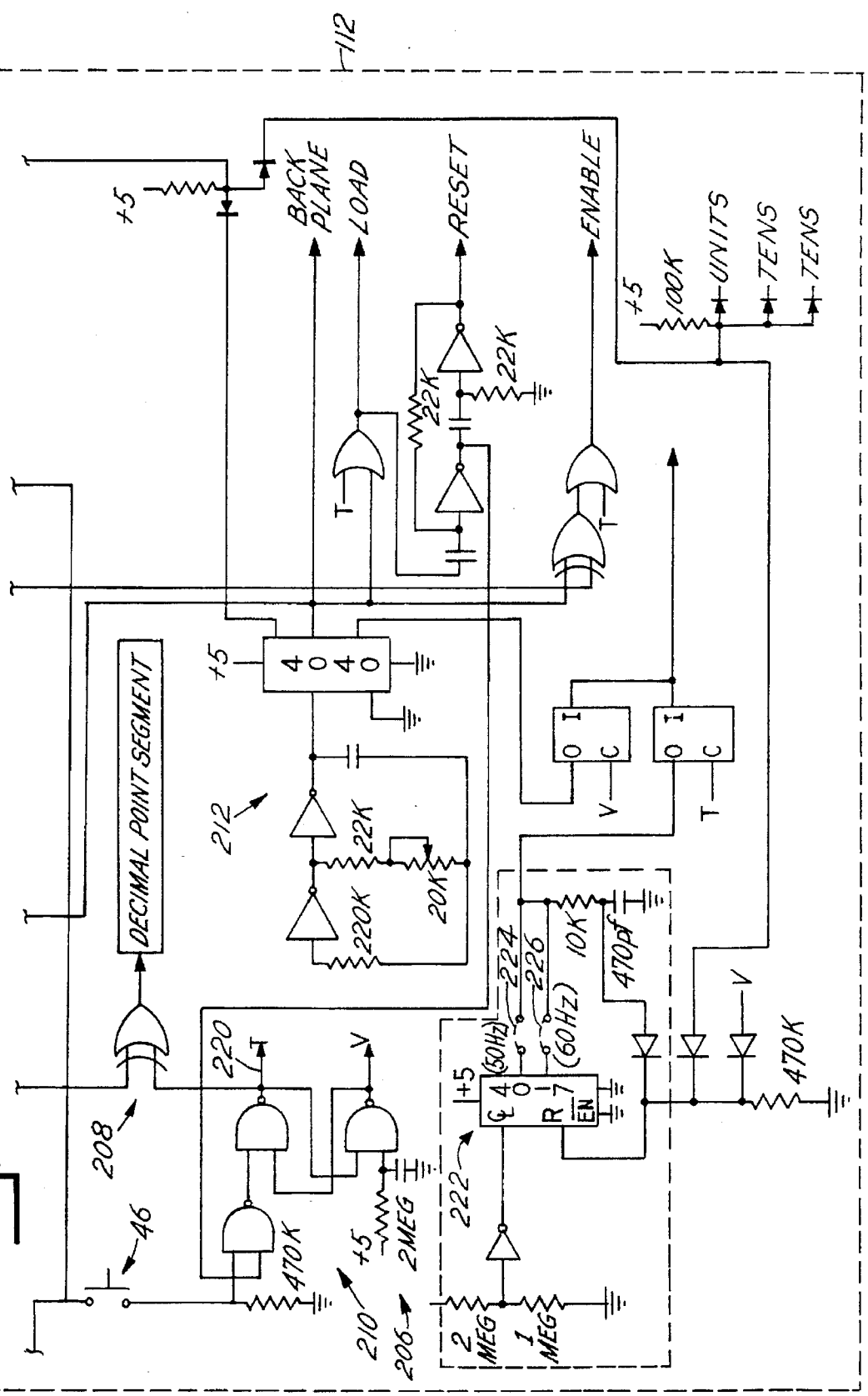

As shown in FIGS. 5B and 5C, the circuit 112 includes a test status circuit 206, decimal point control circuitry 208, low battery comparator 216, clock circuitry 212, and counter circuit 214. The test status circuit 206 includes a flip flop 216, a V (or voltage test) lead 218 and a T (or GFCI trip time test) lead 220. The V lead 218 will initially provide a high voltage output. Upon closing the button 46, however, the flip flop 216 changes the outputs of the T and V leads 218, 220, such that the V lead 218 is brought to a low voltage and a positive voltage is provided on the T line 220. Accordingly, without a high V signal, switch 140 activates, so that the constant current source 104 provides a constant current draw from the hot lead 30.

The decimal point control circuitry 208 controls the activation of a decimal point segment in the display 56. The segment is activated when the T lead 220 is high.

The comparator 210 compares a voltage related to the signal at the input to the voltage correcting amplifier 136 to an eight volt standard (which is dependant on the voltage of the battery 188). If the difference is substantial, the comparator 210 gives a high output. This activates the low battery segment 58 and advises the user that the nine volt battery 166 should be replaced.

The clock circuitry 212 is temperature compensated and supplies binary timing signals for the operation of the tester 10. The timing signals are used for the backplane lighting of the displays 54, 56, an enable signal for the displays 54, 56 and a load signal for the display driver 178.

The counter circuit 214 includes a clock 222 that generates periodic pulses. A clock output pulse occurs every 0.1 second. The clock 222 is reset after 53 "tenths" of a second have been counted. The clock 222 is also reset when either the T lead 220 again goes to a low voltage (and the V lead becomes high). The clock 222 stops when the voltage of the hot lead 30 drops to zero (which occurs when the receptacle GFCI 22 trips). The clock 222 also includes first and second straps 224, 226. The straps 224, 226 allow the tester 10 to operate with either 50 hertz or 60 hertz input signals, depending on which strap is connected.

Thus, in operation, once the tester 10 is plugged into the receptacle GFCI 22, the wiring indication display 54 indicates whether the hot, neutral, and ground leads 30–34 of the receptacle GFCI 22 have been properly connected, respectively, to the hot, neutral and ground conducting lines 36–40 of the local electrical circuit. If the wiring is in a correct state, the display 56 indicates the voltage level between the hot and ground leads 30, 32.

Assuming all conductors 36–40 have been properly wired to the receptacle GFIC 22, the user of the tester 10 may initiate a timed GFCI test by pressing the button 46. Upon activation, the constant current source 104 supplies a constant AC "fault current" flow directly between the hot and ground lines 36, 40 in the electrical circuit, thereby establishing a controlled differential between the current magnitudes on the hot and neutral lines 36, 38. The magnitude of this fault current is intentionally chosen to emulate a test within the range of currents prescribed by industry standards for proper ground fault circuit interrupter performance.

The logic, timing, and control circuitry 112 and display 108 provide a continuous count of the time during which the controlled current differential exists. When the voltage between the hot and neutral leads 30, 32 drops to near zero (so that the counter is no longer powered), the voltmeter 106 enables the display 56, or thus provides a trip indication signal, so that if 51 tenths of a second have been counted by the counting circuitry without such a trip indicating signal, the time count is loaded into the display 56. Also, clock 222 is reset and the incrementing display of time stops.

If the voltage dropped to zero before 5.1 seconds elapsed, the GFCI has properly tripped within the predetermined maximum trip time. The display 56 then displays the elapsed time at which the receptacle GFCI 22 tripped. If the receptacle GFCI 22 did not trip by the maximum prescribed time, then the display 56 flashes the maximum prescribed time as an indication to the user that the GFCI failed to function as expected.

A preferred embodiment of the present invention has been described herein. It is to be understood, of course, that changes and modifications may be made in the preferred embodiment without departing from the true scope and spirit of the present invention, as defined by the appended claims.

I claim:

1. A hand-held testing device for a receptacle ground fault circuit interrupter, said interrupter having a hot, neutral, and ground leads and having a dormant state, in which current may flow through said hot lead, and a tripped state, in which said interrupter substantially blocks current flow through said hot lead, said testing device, comprising; in combination:

a plug for interconnecting to said leads of said interrupter;

a current source for introducing a substantially constant fault current between said hot and ground leads, wherein said fault current has a predetermined value which is independent of the voltage across said hot and neutral leads;

a timer circuit for counting time after said current source introduces said fault current;

a control circuit for determining whether said interrupter entered said tripped state within a designated trip time and responsively generating a corresponding trip indicator signal; and display means for receiving said trip indicator signal and responsively indicating whether said interrupter entered said tripped state within said designated trip time.

2. A hand-held testing device as claimed in claim 1 wherein said display segment substantially continually receives said time count signal and displays said time until said interrupter enters said tripped state.

3. A hand-held testing device as claimed in claim 2 wherein said display segment displays a time at which said interrupter enters said tripped state, when said receptacle ground fault circuit interrupter succeeds in entering said tripped state within said designated trip time.

4. A hand-held testing device as claimed in claim 2 wherein said display segment shows said designated trip time when said receptacle ground fault circuit interrupter fails to enter said tripped state within said designated trip time.

5. A hand-held testing device as claimed in claim 4 wherein said constant current source supplies between 5 and 7 milliamps.

6. A hand-held testing device as claimed in claim 4 including current selection means for selecting a magnitude of said constant current source from a range of current magnitudes.

7. A hand-held testing device as claimed in claim 6 further comprising trip time selection means for selecting a designated trip time corresponding to said magnitude of said constant current source.

8. A hand-held testing device as claimed in claim 1 wherein said current source provides a substantially constant alternating current.

9. A hand-held testing device as claimed in claim 1 further comprising:

a voltmeter circuit for measuring a voltage level between said hot and said ground leads and for responsively generating a voltage signal; and a voltage display for receiving said voltage signal and displaying said voltage level.

10. A hand-held testing device as claimed in claim 1 wherein said receptacle defines correct and incorrect wiring states, said correct state defined by said hot, neutral, and ground leads being connected, respectively, to a hot conducting line, a neutral conducting line, and a ground conducting line of an electrical power circuit, and said incorrect state being defined by a different wiring condition, said device further including a wiring detector circuit for sensing said wiring status and responsively generating a wiring indication signal indicative of said wiring status.

11. A hand-held testing device as claimed in claim 10 further including wiring display means for receiving said wiring indication signal and responsively displaying said wiring status.

12. A hand-held testing device as claimed in claim 11 further including an exterior casing comprised of electrically insulating plastic.

13. A hand-held testing device for a receptacle ground fault circuit interrupter, said interrupter having a hot, neutral, and ground leads and having a dormant state, in which current may flow through said hot lead, and a tripped state, in which said interrupter substantially blocks current flow through said hot lead, said testing device, comprising; in combination:

a plug for interconnecting to said leads of said interrupter;

a current source for introducing a substantially constant fault current between said hot and ground leads, wherein said fault current has a predetermined value which is independent of the voltage across said hot and neutral leads;

a timer circuit for counting time after said current source introduces said fault current;

a control circuit for determining whether said interrupter entered said tripped state within a designated trip time and responsively generating a corresponding trip indicator signal; and display means for receiving said trip indicator signal and responsively indicating whether said interrupter entered said tripped state within said designated trip time;

an exterior casing substantially enclosing said current source, timer circuit, and control circuit, said casing defining a plug assembly and a display assembly attached to said plug assembly, said plug assembly defining a plug longitudinal axis, said display assembly also defining a display longitudinal axis positioned at an angle of at least 15° with respect to said plug longitudinal axis.

* * * * *